(12) United States Patent
Singh et al.

(10) Patent No.: US 6,404,067 B1
(45) Date of Patent: Jun. 11, 2002

(54) PLASTIC BALL GRID ARRAY PACKAGE WITH IMPROVED MOISTURE RESISTANCE

(75) Inventors: Kuljeet Singh, Folsom; Joseph C. Barrett, El Dorado, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/618,968

(22) Filed: Jul. 19, 2000

Related U.S. Application Data

(63) Continuation-in-part of application No. 09/088,469, filed on Jun. 1, 1998, now abandoned.

(51) Int. Cl.⁷ .............................................. H01L 23/48
(52) U.S. Cl. ..................... 257/784; 257/684; 257/701; 257/787; 257/780; 257/698; 257/774
(58) Field of Search ............................... 257/784, 684, 257/698, 701, 787, 780, 774, 738

(56) References Cited

U.S. PATENT DOCUMENTS

| | | |
|---|---|---|
| 5,243,141 A | 9/1993 | Yonehara |
| 5,250,842 A | 10/1993 | Ikeda |
| 5,327,008 A | 7/1994 | Djennas et al. |
| 5,385,869 A * | 1/1995 | Liu et al. ................... 437/209 |
| 5,615,086 A | 3/1997 | Yoneda et al. |
| 5,623,123 A | 4/1997 | Umehara |
| 5,637,913 A | 6/1997 | Kajihara et al. |
| 5,668,405 A | 9/1997 | Yamashita |
| 5,708,567 A | 1/1998 | Shim et al. |
| 5,737,191 A | 4/1998 | Horiuchi et al. |
| 5,767,446 A | 6/1998 | Ha et al. |
| 5,777,391 A * | 7/1998 | Nakamura et al. .......... 257/778 |
| 5,952,611 A | 9/1999 | Eng et al. |
| 6,054,772 A * | 4/2000 | Mostafazadeh et al. ..... 257/781 |

FOREIGN PATENT DOCUMENTS

JP  410098130 A  *  4/1998

* cited by examiner

Primary Examiner—David L. Talbott
Assistant Examiner—Luan Thai
(74) Attorney, Agent, or Firm—Blakely, Sokoloff, Taylor & Zafman LLP

(57) ABSTRACT

An integrated circuit package including a substrate, an integrated circuit, and an encapsulant. The substrate has two opposing surfaces and an opening that extends between the two surfaces. The integrated circuit is mounted to the substrate substantially centered over the opening such that a portion of the opening is left uncovered by the integrated circuit. The encapsulant encapsulates the integrated circuit with a portion of the encapsulant extending between the two surfaces of the substrate and attached to the lower surface of the integrated circuit.

13 Claims, 3 Drawing Sheets

PLASTIC BALL GRID ARRAY PACKAGE WITH IMPROVED MOISTURE RESISTANCE

RELATED APPLICATIONS

This application is a continuation-in-part of application Ser. No. 09/088,469, filed Jun. 1, 1998, now abandoned.

FIELD OF THE INVENTION

The present invention relates to an integrated circuit package.

BACKGROUND OF THE INVENTION

Integrated circuits are typically assembled into packages that are mounted to a printed circuit board. A plastic ball grid array (PBGA) package includes an integrated circuit that is mounted to a substrate. The substrate is typically a printed circuit board which has routing traces, power/ground planes and vias that interconnect the integrated circuit to a plurality of solder balls located on a bottom surface of the substrate. The solder balls are reflowed to attach the package to an external printed circuit board such as the motherboard of a computer.

The integrated circuit is electrically connected to the substrate by bond wires. The bond wires are typically attached to the integrated circuit and substrate with a wire bond machine. To prevent movement during the wire bond process the integrated circuit is attached to the substrate with an adhesive. The adhesive is typically a silver filled epoxy which tends to absorb moisture during the assembly process. After the wire bonding process is completed, the integrated circuit, bond wires and substrate are placed in a mold that is injected with an encapsulant which encapsulates the circuit. The solder balls are then attached to the substrate.

The solder balls are typically reflowed by applying heat to the entire package. The heat may convert the moisture absorbed by the epoxy into steam. The creation of steam may crack the package and separate the integrated circuit from the substrate. For this reason the integrated circuit/substrate subassembly is handled in a way to minimize moisture absorption before, during and after the wire bond process. This may require humidity controlled storage and assembly areas. Controlling the humidity during the assembly process increases the complexity and cost of mass producing the package. It would be desirable to provide a PBGA package which is more reliable and less sensitive to moisture in a manufacturing environment.

DETAILED DESCRIPTION OF THE INVENTION

One embodiment of the present invention is an integrated circuit package which has a portion of an encapsulant that extends through an opening in the substrate and is attached to a lower surface of an integrated circuit mounted to the substrate. The encapsulant also encapsulates a top surface and side surfaces of the integrated circuit. The encapsulant that extends through the substrate provides a relatively robust mechanical interconnect between the integrated circuit and the substrate to prevent separation during a subsequent solder reflow process. The opening reduces the amount of adhesive that is used to attach the integrated circuit to the substrate for a wire bond process. The reduction in adhesive lowers the amount of moisture that is absorbed by the package.

Figure 1:
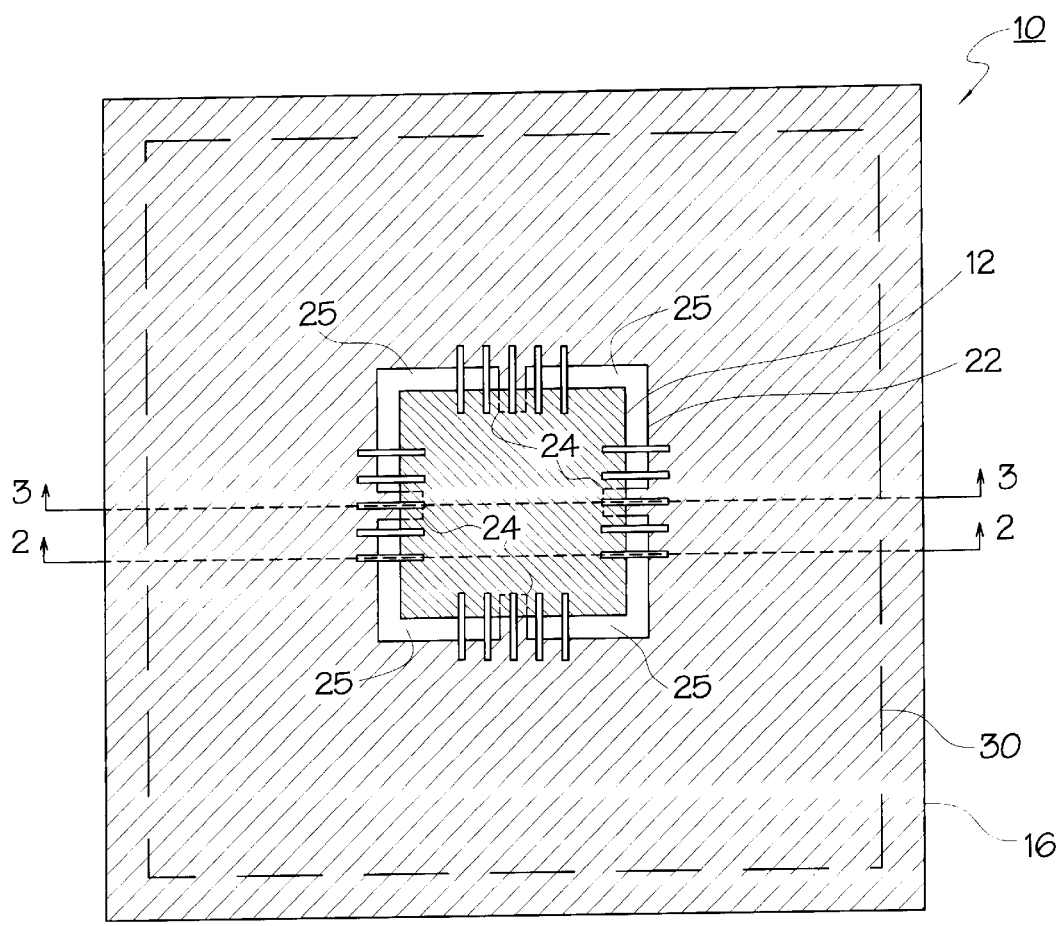
FIG. 1 is a top view of an the integrated circuit package of the present invention.
Figure 2:
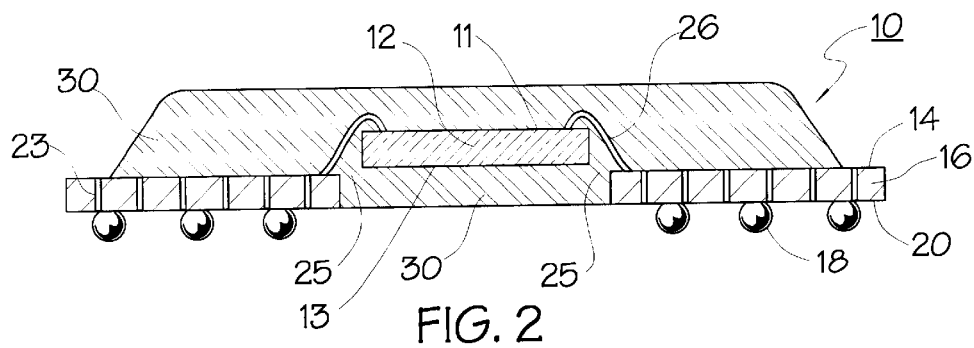
FIG. 2 is a side sectional view of the integrated circuit package of FIG. 1 along line 2—2.
Figure 3:
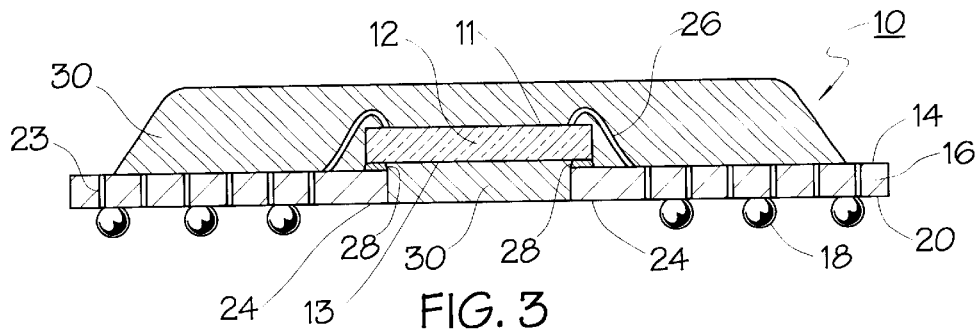
FIG. 3 is a side sectional view of the integrated circuit package of FIG. 1 along line 3—3.

Referring to the drawings more particularly by reference numbers, FIGS. 1 to 3 show an embodiment of an integrated circuit package 10 of the present invention. The package 10 may include a substrate 16 having a first surface 14, an opposing second surface 20, and an opening 22 that extends from the first surface to the second surface. The package 10 may include an integrated circuit 12 having a third surface 11 and an opposing fourth surface 13 that is mounted to the first surface 14 of the substrate 16. The package 10 may further have a plurality of solder balls 18 that are attached to the second surface 20 of the substrate 16. The substrate 16 may be a printed circuit board which has surfaces pads, routing traces (not shown) and vias 23 that electrically connect the first surface 14 to the second surface 20.

As shown in FIGS. 1 to 3, the center opening 22 may have a size and shape such that the substrate 16 will support the integrated circuit 12 while a substantial portion of the fourth surface 13 of the integrated circuit 12 is adjacent the opening 22 and, therefore, uncovered by the substrate 16. The size and shape of the opening 22 is also such that an open passage 25 is left outside the periphery of the integrated circuit 12. The open passage 25 allows encapsulant 30 flow around the integrated circuit and attach to the fourth surface 13 of the integrated circuit 12. For clarity, the top view of FIG. 1 shows only an outline of the encapsulant 30 to allow the substrate 16, the integrated circuit 12, and the related structures and spatial relationships to be shown.

The substrate 16 may further have a plurality of tabs 24 that extend into the opening 22. The tabs 24 may support the integrated circuit 12 during the assembly process of the package 10. The package 10 may have a plurality of bond wires 26 that electrically connect the integrated circuit 10 to the substrate 16. The package 10 may further include an adhesive 28 that attaches the integrated circuit 12 to the substrate 16 during the wire bond process. The adhesive may be a silver filled epoxy.

The integrated circuit 12 may be encapsulated by an encapsulant 30. A portion of the encapsulant 30 may extend through the open passage 25 between the edge of the center opening 22 and the integrated circuit 12 and into the opening to form a continuous body of encapsulant and become attached to the integrated circuit 12. This portion of the encapsulant 30 may provide a robust mechanical interconnect between the integrated circuit 12 and the substrate 16. The opening 22 also reduces the amount of adhesive 28 under the integrated circuit 12 and the amount of moisture that is absorbed by the package 10.

Figure 4A:
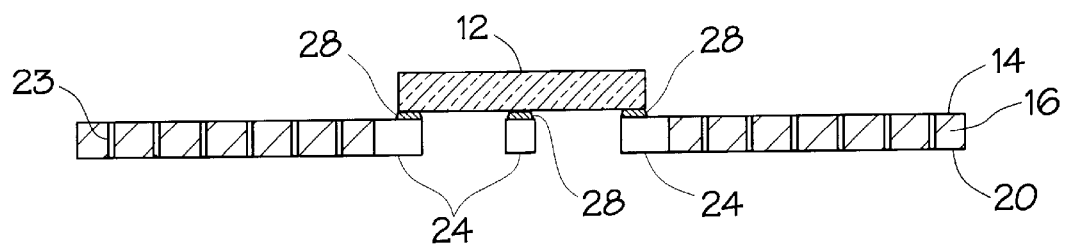
FIGS. 4a–c show a process for assembling the integrated circuit package.
Figure 4B:
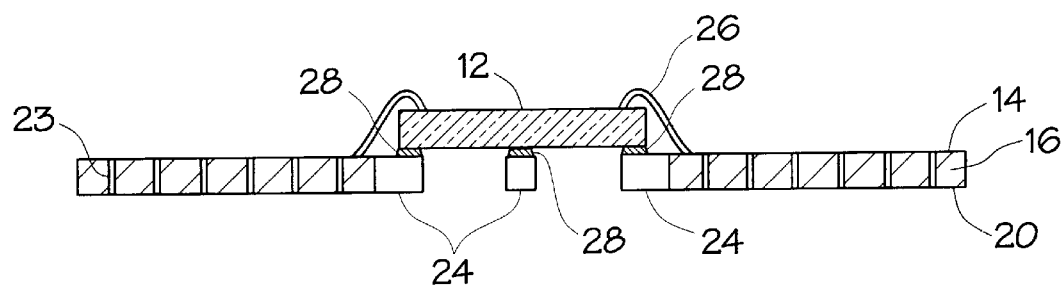
Figure 4C:
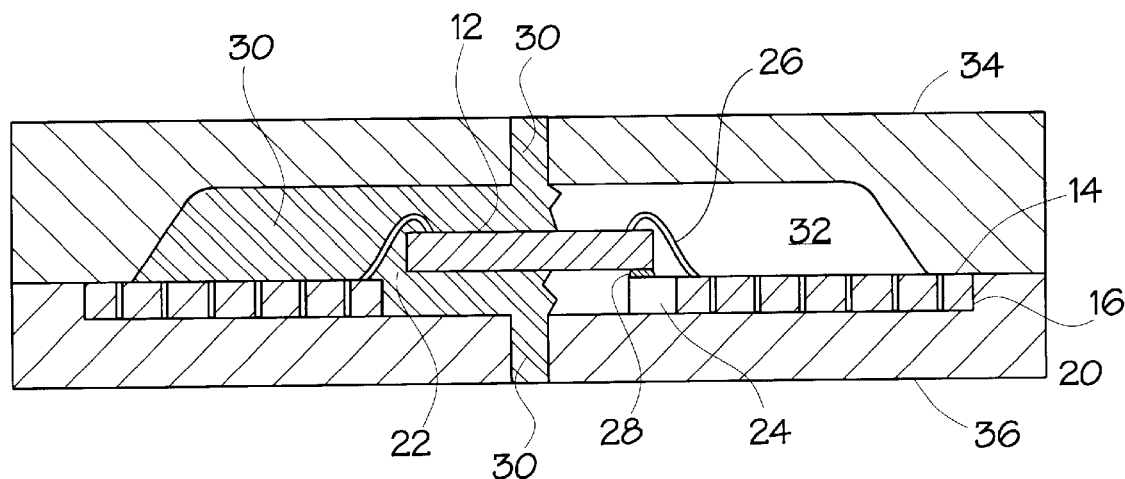

FIGS. 4a–c show a process for assembling the integrated circuit package 10. FIGS. 4a–c show a cross section along line 2—2 in FIG. 1. The integrated circuit 12 is initially attached to the substrate 16. The adhesive 28 may attach the integrated circuit 12 to the tabs 24 of the substrate 16. The bond wires 26 may then be attached to the integrated circuit 12 and the substrate 16.

Figure 5:
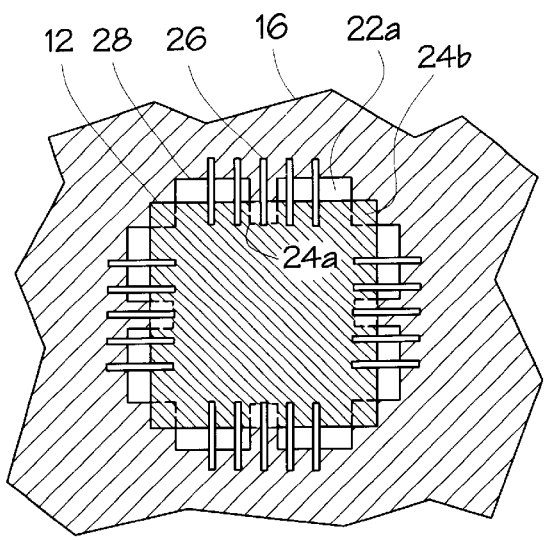
FIG. 5 is a top view of an alternate embodiment of an integrated circuit package.

As shown in FIG. 4c, the substrate 16, integrated circuit 12 and bond wires 26 are then placed into a cavity 32 of a mold 34. The cavity 32 is then filled with the encapsulant 30. A portion of the encapsulant 30 is allowed to flow through the open passage 25 between the edge of the center opening and the integrated circuit and into the center opening 22 of the substrate 16 to form a continuous body of encapsulant. After the encapsulant 30 is cured the encapsulated integrated circuit 12 is removed from the mold 34 so that the solder balls 18 can be attached to the substrate 16. FIG. 5 shows an alternate embodiment of an integrated circuit package of the present invention. The substrate 16 may have a plurality of center tabs 26a and corner tabs 26b that extend into the opening 22a. The tabs may support the integrated circuit 12 during the assembly process of the package 10.

Figure 6:
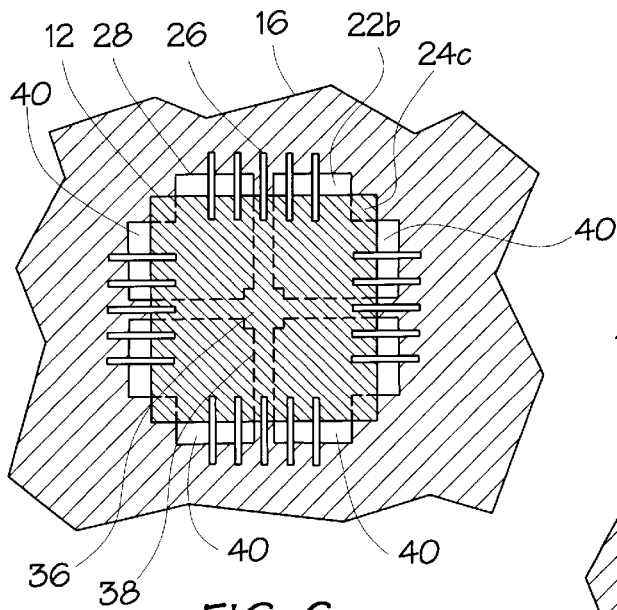
FIG. 6 is a top view of an alternate embodiment of an integrated circuit package.

FIG. 6 shows an alternate embodiment of an integrated circuit package of the present invention. The substrate 16 may have support segments 38 that separate the opening 22b into areas 40. In the exemplary embodiment shown in FIG. 6, the support segments separate the opening 22b into four areas 40. The substrate 16 may have a center die paddle 36 connected to the support segments 38. The substrate 16 may have a plurality of corner tabs 24c that extend into the opening 22b. The die paddle 36 and/or corner tabs may provide greater attach area and support for the integrated circuit 12 during the wire bond process than the single opening embodiment shown in FIGS. 1 and 5. The size and shape of the opening 22b leaves an open passage outside the periphery of the integrated circuit 12. The open passage allows encapsulant 30 flow around the integrated circuit and into the areas 40 and become attached to the integrated circuit 12 during the mold process to form a continuous body of encapsulant. The encapsulant 30 provides a relatively robust mechanical interconnect between the integrated circuit 12 and the substrate 16.

Figure 7:
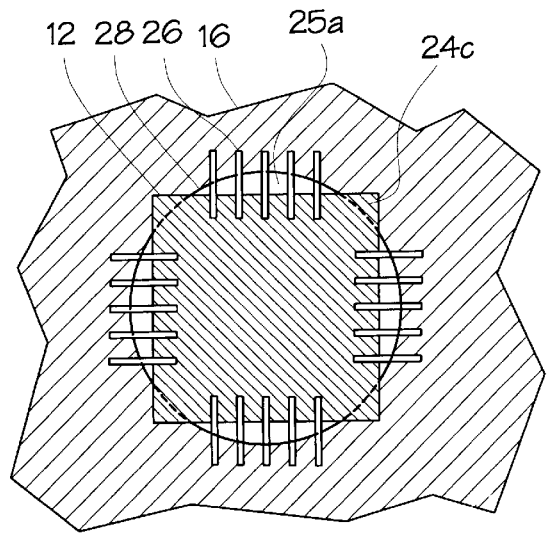
FIG. 7 is a top view of an alternate embodiment of an integrated circuit package.

FIG. 7 shows an alternate embodiment of an integrated circuit package of the present invention. The opening 22d is circular with a diameter that is less than the diagonal of the rectangular integrated circuit 12. The substrate 16 may support the corners of the integrated circuit. The size and circular shape of the opening 22d leaves an open passage 25a outside the periphery of the integrated circuit 12. The open passage 25a allows encapsulant 30 flow around the integrated circuit and attach to the lower surface of the integrated circuit 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. In particular, the opening in the substrate may be of any form that provides support for the integrated circuit during the assembly process while leaving a substantial portion of the lower surface of the integrated circuit uncovered by the substrate and leaving an open passage outside the periphery of the integrated circuit that allows encapsulant to flow around the integrated circuit and attach to the lower surface of the integrated circuit.

What is claimed is:

1. An integrated circuit package, comprising:
    a substrate having a first surface, an opposing second surface, and an opening that extends from the first surface to the second surface;
    an integrated circuit having a third surface and an opposing fourth surface, the fourth surface of the integrated circuit mounted to the first surface of the substrate, the integrated circuit substantially centered over the opening such that a portion of the opening is left uncovered by the integrated circuit;
    a silver filled adhesive that attaches the substrate to the integrated circuit; and,
    an encapsulant that encapsulates the integrated circuit, a portion of the encapsulant extending from the first surface to the second surface of the substrate and attached to the fourth surface of the integrated circuit.

2. The package as recited in claim 1, further comprising a solder ball that is attached to the second surface of the substrate.

3. The package as recited in claim 1, wherein the integrated circuit is mounted to a plurality of tabs that extend into the opening of the substrate, each of the plurality of tabs having a first end that is connected to the substrate and an opposing second end that is unconnected.

4. The package as recited in claim 1, further including a plurality of support segments that separate four areas in the opening.

5. The package as recited in claim 4, further including a die paddle connected to the support segments.

6. The package as recited in claim 1, further comprising a bond wire that is attached to the integrated circuit and the substrate.

7. The package as recited in claim 1, wherein the substrate is a printed circuit board.

8. An integrated circuit package, comprising;
    an integrated circuit having a first surface and an opposing second surface;
    a circuit support means for supporting the integrated circuit, the circuit support means defining an opening substantially centered over the second surface of the integrated circuit such that a portion of the opening is left uncovered by the integrated circuit;
    a silver filled adhesive means for attaching the circuit support means to the integrated circuit; and,
    an encapsulating means for encapsulating the integrated circuit, a portion of the encapsulating means attached to the first surface and to the second surface of the integrated circuit, and a portion of the encapsulating means extending from the first surface to the second surface of the integrated circuit through a the portion of the opening left uncovered by the integrated circuit.

9. The package as recited in claim 8, further comprising a solder ball that is attached to the circuit support means.

10. The package as recited in claim 8, wherein the integrated circuit is mounted to a plurality of tab means for supporting the integrated circuit, the tab means extending into the opening defined by the circuit support means.

11. The package as recited in claim 8, further including a plurality of support beam means for supporting the integrated circuit, the support beam means further defining four areas in the opening.

12. The package as recited in claim 11, further including a paddle means for supporting the integrated circuit, the paddle means connected to the support segments.

13. The package as recited in claim 18, further comprising a bond wire that is attached to the integrated circuit and the circuit support means.

* * * * *

UNITED STATES PATENT AND TRADEMARK OFFICE
CERTIFICATE OF CORRECTION

PATENT NO.     : 6,404,067 B1
DATED          : June 11, 2002
INVENTOR(S)    : Singh et al.

It is certified that error appears in the above-identified patent and that said Letters Patent is hereby corrected as shown below:

Column 4,
Line 62, delete "in claim 18" and insert -- in claim 8 --.

Signed and Sealed this

Twenty-sixth Day of November, 2002

Attest:

Attesting Officer

JAMES E. ROGAN
Director of the United States Patent and Trademark Office